United States Patent [19]

Kashida et al.

[11] Patent Number: 5,098,515
[45] Date of Patent: Mar. 24, 1992

[54] METHOD FOR THE PREPARATION OF A SILICON CARBIDE-SILICON NITRIDE COMPOSITE MEMBRANE FOR X-RAY LITHOGRAPHY

[75] Inventors: Meguru Kashida; Yoshihiro Kubota; Yoshihiko Nagata, all of Gunma, Japan

[73] Assignee: Shin-Etsu Chemical Co., Ltd., Tokyo, Japan

[21] Appl. No.: 627,270

[22] Filed: Dec. 14, 1990

[30] Foreign Application Priority Data

Dec. 26, 1989 [JP] Japan .................................. 1-339094

[51] Int. Cl.$^5$ ...................... H01L 21/306; B44C 1/22; C03C 15/00; C03C 25/06
[52] U.S. Cl. .................................. 156/659.1; 156/644; 156/657; 156/662; 204/192.1; 378/35
[58] Field of Search .................. 156/644, 657, 659.1, 156/662; 378/34, 35; 430/5; 204/192.1, 192.11, 192.12, 192.16, 192.25, 192.3

[56] References Cited

U.S. PATENT DOCUMENTS 4,994,141  2/1991  Harms et al. .................. 156/657 X

*Primary Examiner*—William A. Powell
*Attorney, Agent, or Firm*—McAulay Fisher Nissen Goldberg & Kiel

[57] ABSTRACT

The inventive method provides a membrane for X-ray lithography compositely composed of silicon carbide and silicon nitride having high performance in respect of stability against high energy beam irradiation and transparency to visible light. The method comprises depositing a composite film of a specified $SiC:Si_3N_4$ molar proportion by sputtering on a silicon wafer as the substrate under such conditions that the thus deposited film is under a compressively stressed state, annealing the substrate bearing the composite film deposited thereon at a specified temperature so as to bring the composite film under a tensile internal stress and then removing the substrate by etching leaving a frame portion.

6 Claims, No Drawings

METHOD FOR THE PREPARATION OF A SILICON CARBIDE-SILICON NITRIDE COMPOSITE MEMBRANE FOR X-RAY LITHOGRAPHY

BACKGROUND OF THE INVENTION

The present invention relates to a method for the preparation of a composite membrane of silicon carbide and silicon nitride used for X-ray lithography. More particularly, the invention relates to a method for the preparation of a silicon carbide-silicon nitride composite membrane used for X-ray lithography having an outstandingly high transparency and free from the changes in the internal stress even by irradiation with high-energy beams such as high-energy electron beams and synchrotron radiations.

Along with the trend in recent years toward finer and finer patterning in the manufacture of semiconductor devices, the technology of X-ray lithography is very promising and highlighted as a patterning process in the near future in place of the conventional photolithography. Similarly to the photomasks used in the photolithography, an X-ray-transmitting membrane, referred to as an X-ray membrane hereinafter, is used as a mask in the X-ray lithography to serve as a substrate for the X-ray-absorbing patterning materials. An X-ray membrane must satisfy several requirements in order that the X-ray lithography by using the same can be performed successfully including, for example, that the membrane has a smooth surface without defects or pinholes and has a high mechanical strengths suitable for practical use in an industrial manufacturing process, that the membrane has a high light transmission which is essential in order to facilitate alignment of the mask with high precision, that the membrane has high resistance against the attack of various chemicals and moisture or water not to be damaged in the steps of etching and washing, that the membrane can withstand irradiation with high-energy beams such as high-energy electron beams and synchrotron radiations not to cause significant changes in the performance, and so on.

Various materials have been proposed for the X-ray membranes to comply with the above mentioned requirements including boron-doped silicon Si, silicon nitride $Si_3N_4$, silicon carbide SiC and the like, of which silicon carbide is accepted as the most promising material in respect of the high Young's modulus to withstand irradiation with high-energy beams.

The X-ray membranes of silicon carbide or silicon nitride are prepared by utilizing the process of chemical vapor deposition (CVD) of the material on a substrate such as silicon followed by removal of the substrate material. A problem in the CVD method is that, since the film-forming material to be deposited on the substrate surface is formed by the chemical decomposition of the gaseous starting material or materials, undesirable extraneous species formed by the decomposition are unavoidably taken into the deposition of the film on the substrate surface to act as impurities in the membrane which cause several disadvantages. For example, the impurities may be readily dissipated by the irradiation with high-energy beams so as to cause occurrence of strain, changes in the stress, decrease in the mechanical strengths, decrease in the optical transparency and so on in the membrane. Further, it is of course that such impurities may result in the occurrence of pinholes and nodules on the surface of the membrane greatly affecting the quality of the membrane.

Alternatively, membranes of silicon carbide or silicon nitride can be prepared also by utilizing the method of sputtering disclosed, for example, in Japanese Patent Kokai 63-315768. Despite the advantages of the sputtering method that the content of impurities is relatively low in the membrane and the membrane is free from pinholes and nodules, the method is not free from the problems that the membrane of silicon carbide or silicon nitride is subject to the appearance of strain or distortion under irradiation with high-energy beams in a large dose as a consequence of the high amorphousness of the membrane. In addition, the membrane of silicon carbide or silicon nitride prepared by utilizing the sputtering method usually has a relatively low transmission of light which sometimes cannot exceed 25 to 30% at a wavelength of 633 nm when the membrane has a thickness of 1.0 $\mu$m. The inventors previously have developed a composite X-ray membrane composed of silicon carbide and silicon nitride which is superior to the X-ray membrane of silicon carbide alone in many respects although the composite membrane is still not quite satisfactory in respect of the resistance against high energy-beam irradiation.

SUMMARY OF THE INVENTION

The present invention accordingly has an object to provide a novel method for the preparation of a composite membrane for X-ray lithography composed of silicon carbide and silicon nitride and having excellent resistance against irradiation with high-energy beams.

Thus, the inventive method for the preparation of a composite membrane for X-ray lithography composed of silicon carbide and silicon nitride comprises the steps of:

(a) depositing a composite material of silicon carbide and silicon nitride by the sputtering method employing a target composed of silicon carbide and silicon nitride to form a composite film on the surface of a substrate, which is usually a high purity silicon wafer, kept at a specified temperature under such conditions that the film deposited on the substrate surface is under a compressive stress;

(b) annealing the composite film on the substrate surface to bring the composite film under a tensile stress; and (c) removing the substrate partly from the annealed composite film so that the film is an unsupported membrane on a frame.

In particular, the target employed in the sputtering should be composed of silicon carbide and silicon nitride in a molar ratio in the range from 95:5 to 30:70. Further, it was found that the largest factor influencing the condition of stress in the deposited composite film on the substrate surface is the pressure of the atmosphere in the sputtering.

The above described inventive method is characterized by the properties of the membrane formed thereby that the membrane is crystallographically amorphous and under a tensile stress in the range from $0.1 \times 10^9$ to $8.0 \times 10^9$ dynes/cm².

DETAILED DESCRIPTION OF THE PREFERRED EMBODIMENTS

As is understood from the above given description, the characteristic features of the inventive method consist in the specific conditions in the sputtering so as to impart the deposited composite film with a compressive stress in step (a) and the annealing treatment of the thus compressively stressed composite film so as to convert the compressive stress into a tensile stress.

The conditions of the sputtering in step (a) of the inventive method are not particularly limitative and can be undertaken according to a conventional procedure. It is preferably, however, that the sputtering is performed by the so-called magnetron sputtering in respect of the relatively high rate of film deposition enabling mass production of the X-ray membranes. The atmospheric gas in the sputtering chamber is an inert gas such as argon, xenon and the like but it is optional that these gases are mixed with other inert gases such as helium, nitrogen and the like.

The target employed in the sputtering in step (a) is a composite or mixture of silicon carbide and silicon nitride. Since the chemical composition of the deposited composite film is almost identical with that of the target material, the proportion of the two ingredients in the target should be selected to be identical with the desired chemical composition of the composite membrane. The molar proportion of silicon carbide to silicon nitride in the target material should be in the range from 95:5 to 30:70 or, preferably, from 80:20 to 40:60. When the molar proportion of the silicon carbide is too large in the target, the X-ray membrane prepared from the composite target may have an unduly low transparency to visible light hardly to improve the low transparency in the membranes formed from silicon carbide alone. When the molar proportion of the silicon carbide is too small in the target, on the other hand, the X-ray membrane prepared from the composite target may have an unduly low resistance against chemicals hardly to give an improvement in this regard to the membranes formed from silicon nitride alone. In particular, a molar proportion of silicon carbide to silicon nitride of around 50:50 is preferable in respect of the largest rate of film deposition which can be as large as almost twice of that in the film deposition with a target of silicon carbide alone contributing to the enhancement of the productivity. The binary composite target of silicon carbide and silicon nitride is prepared by uniformly blending powders thereof in a specified proportion and compression-molding and sintering the powder blend using, if necessary, a hot press. Each of the base powders of silicon carbide and silicon nitride should desirably has a purity as high as possible or at least 99% or, preferably, at least 99.9%.

The electric power supplied to the electrodes of the sputtering chamber should desirably be at least 5 watts per $cm^2$ of the surface area of the target. It is of course that the rate of film deposition can be increased by increasing the electric power for the sputtering. The substrate in the sputtering is kept at an elevated temperature which, however, should not exceed 500° C., or, preferably, at a temperature in the range from 150° to 300° C. When the temperature of the substrate during the sputtering is too high, no sufficient increase in the crystallinity in the deposited composite film can be obtained in the subsequent annealing treatment consequently resulting in a decrease in the stability of the stress in the membrane by the irradiation with high energy beams. When the temperature of the substrate during the sputtering is too low, on the other hand, the strength of adhesion between the deposited composite film and the substrate surface would be decreased.

It is very important to adequately select the pressure of the sputtering atmosphere so as to obtain a deposited composite film on the substrate surface under an internal compressive stress which is then converted by the subsequent annealing treatment in step (b) into a tensile stress in the range from $0.1 \times 10^9$ to $8.0 \times 10^9$ dynes/$cm^2$ in order that the deposited composite film on the substrate surface can be processed into an unsupported membrane in step (c). Namely, the internal stress of the deposited composite film on the substrate surface is usually changed from compressive toward tensile by the annealing treatment and the degree of the change before and after the annealing treatment is larger when the annealing temperature is higher. The optimum pressure of the sputtering atmosphere can be determined according to the results of the preliminary experiments for the correlation between the sputtering pressure and the internal stress of the deposited composite surface film at several different substrate temperatures, the other conditions being constant, and for the correlation between the conditions of the annealing treatment and the changes caused thereby in the internal stress of the composite films. The composite film deposited under the above mentioned conditions on the substrate surface is crystallographically amorphous.

The step (b) to follow the above described deposition of the composite film is an annealing treatment which is performed at a temperature higher than 500° C. or, preferably, higher than 700° C. When the annealing temperature is too low, no sufficient effect of the annealing treatment can be obtained so that the resulting membrane may be subject to an undue increase in the internal stress by the irradiation with high energy beams. Usually, a sufficient effect of the annealing treatment can be obtained by the annealing treatment for at least 2 hours or, preferably, for 4 to 8 hours.

The step (c) is for the preparation of an unsupported membrane from the composite film deposited on the substrate surface by removing the substrate by etching leaving the frame portion. The procedure for this processing can be conventional.

In the following, examples and comparative examples are given to illustrate the method of the invention in more detail but not to limit the scope of the invention in any way. The composite films on the substrate surface or membranes obtained in these examples and comparative examples were evaluated for the respective properties by the procedures described below.

Internal stress of the film on the substrate surface

Warping of the substrate, i.e. silicon wafer, was measured before and after deposition of the composite film and before and after the annealing treatment and the stress was calculated from the change in the warping.

Resistance against high energy beam irradiation

The film on the substrate surface was irradiated with a high energy electron beams having an energy of 15 eV in a dose of 1.0 kJ per $cm^2$ and the change in the stress of the membrane was determined as a measure of the resistance against irradiation.

Membrane-formability of the film on the substrate surface

The substrate wafer, on one surface of which a composite film had been deposited by sputtering, was coated on the other surface by the CVD method with a film of amorphous boron nitride in a thickness of 1.0 $\mu m$ to serve as a resist layer against etching. An annular masking frame of stainless steel was put on the resist layer in direct contact and the exposed circular area of the resist layer was removed by dry-etching with carbon tetrafluoride as the etching gas. Thereafter, the silicon wafer in the thus exposed area, i.e. the area having no resist layer, was dissolved away using a 30% aqueous solution of potassium hydroxide as the etching solution leaving the annular portion of the silicon wafer to serve as a frame for the composite membrane. The membrane prepared in this manner was microscopically examined to detect any defects or pinholes and the result was recorded as "Good" or "Poor" for the absence or presence of detectable defects and pinholes.

% transmission of visible light through membrane

The membrane prepared in the above described manner was subjected to the measurement of the transmission of visible light at a wavelength of 633 nm by using a multi-photospectrometer.

EXAMPLE

Fifteen experiments, numbered as No. 1 to No. 15, were conducted in the following manner, of which No. 1 to No. 9 were for the invention and No. 10 to No. 15 were for comparative purpose.

Thus, several target discs for sputtering, each having a diameter of 3 inches and a thickness of 5 mm, were prepared from a silicon carbide powder having a purity of 99.9% and a silicon nitride powder having a purity of also 99.9% blended in varied molar proportions by compression molding and sintering. For comparative purpose, target discs were prepared also from the silicon carbide powder alone or from the silicon nitride powder alone. The target disc was set on the cathode in the sputtering chamber of a high-frequency magnetron sputtering apparatus (Model SPF-332H, manufactured by Nichiden Anerva Co.) and sputtering was performed on a mirror-polished silicon wafer having a diameter of 3 inches and a thickness of 0.6 mm as the substrate kept at a temperature of 250° C. Argon gas was continuously passed through the sputtering chamber at a constant rate of 7 ml per minute and the pressure inside the sputtering chamber was controlled at a specified pressure by the balance of the constant and continuous introduction of the argon gas and evacuation by means of a precision valve. The electric power density was 10 watts per $cm^2$ of the target surface and sputtering was continued for 10 to 15 minutes so that a silicon carbide-silicon nitride composite film having a thickness of 1.0 μm was deposited on the substrate surface. The chemical composition of the thus deposited composite film was identical with that in the target material relative to the molar proportion of silicon carbide and silicon nitride according to the analytical results by the ESCA method.

The silicon substrate on which the composite film was formed was subjected to an annealing treatment in the following manner. Thus, the silicon wafer held on a wafer holder of fused synthetic quartz glass was placed in a furnace kept under a pressure of 20 Torr and the temperature of the furnace was increased at a constant rate of 10° C. per minute to reach a specified plateau temperature up to 900° C., which temperature was maintained for 6 hours before the temperature was decreased at a constant rate of 10° C. per minute down to room temperature. The internal stress of the composite film was changed by this annealing treatment always from compressive to tensile. The thus formed composite films on the substrate surface were examined for the resistance against irradiation with high energy beams and membrane-formability and the membrane prepared therefrom was subjected to the measurement of transparency to visible light in the procedure described above.

The table given below shows the molar proportion of the silicon carbide to silicon nitride $SiC:Si_3N_4$ in the target material, pressure inside the sputtering chamber, temperature of the annealing treatment, internal stress of the composite film either before or after the annealing treatment and % transmission of visible light through the membrane. The value of the internal stress shown in the table is compressive when the numerical figure is preceded by the sign (−) and tensile when preceded by the sign (+). The composite films had excellent resistance against the electron beam irradiation showing absolutely no changes in the internal stress in Experiments No. 1 to No. 10 while the internal stress was changed toward tensile by $0.3 \times 10^9$ dyne/$cm^2$, $0.2 \times 10^9$ dyne/$cm^2$ and $0.2 \times 10^9$ dyne/$cm^2$ in Experiments No. 11, No. 12 and No. 13, respectively. The membrane-formability of the deposited composite films was good in every experiment excepting No. 14 and No. 15.

TABLE

| Experiment No. | $SiC:Si_3N_4$ molar ratio | Pressure, Torr | Internal stress, × $10^9$ dynes/$cm^2$ before annealing | after annealing | Annealing temperature, °C. | Visible light transmission, % |
| --- | --- | --- | --- | --- | --- | --- |
| 1 | 95:5 | 0.01 | (−) 6.0 | (+) 2.4 | 700 | 50 |
| 2 | 85:15 | 0.01 | (−) 6.4 | (+) 2.0 | 700 | 59 |
| 3 | 70:30 | 0.01 | (−) 7.0 | (+) 1.8 | 500 | 65 |
| 4 | 70:30 | 0.01 | (−) 7.0 | (+) 1.7 | 700 | 66 |
| 5 | 70:30 | 0.005 | (−) 7.8 | (+) 1.2 | 900 | 65 |
| 6 | 50:50 | 0.01 | (−) 8.0 | (+) 2.2 | 500 | 74 |
| 7 | 50:50 | 0.01 | (−) 8.0 | (+) 1.6 | 700 | 75 |
| 8 | 50:50 | 0.005 | (−) 8.2 | (+) 1.0 | 900 | 75 |
| 9 | 30:70 | 0.005 | (−) 7.5 | (+) 1.5 | 700 | 73 |
| 10 | 100:0 | 0.005 | (−) 7.0 | (+) 2.6 | 700 | 27 |
| 11 | 0:100 | 0.005 | (−) 8.5 | (+) 0.6 | 700 | 60 |
| 12 | 50:50 | 0.06 | (+) 2.2 | — | — | 75 |
| 13 | 50:50 | 0.05 | (+) 1.6 | (+) 1.9 | 300 | 75 |
| 14 | 50:50 | 0.06 | (+) 2.2 | (+) 10.8 | 700 | — |
| 15 | 50:50 | 0.05 | (+) 1.6 | (+) 11.3 | 700 | — |

What is claimed is:

1. A method for the preparation of a composite membrane for X-ray lithography consisting essentially of silicon carbide and silicon nitride which comprises the steps of:
   (a) depositing a composite material of silicon carbide and silicon nitride by the sputtering method employing a target composed of silicon carbide and silicon nitride in a molar porportion in the range from 95:5 to 30:70 to form a composite film on the surface of a substrate kept at an elevated temperature under such conditions that the film deposited on the substrate surface is under a compressive internal stress;

(b) annealing the composite film on the substrate surface to bring the composite film under a tensile internal stress; and (c) removing the substrate partly from the annealed composite film so that the film is an unsupported membrane on a frame.

2. The method for the preparation of a composite membrane for X-ray lithography as claimed in claim 1 in which the substrate in step (a) is kept at a temperature in the range from 150° to 300° C.

3. The method for the preparation of a composite membrane for X-ray lithography as claimed in claim 1 in which the annealing in step (b) is performed at a temperature of 500° C. or higher.

4. The method for the preparation of a composite membrane for X-ray lithography as claimed in claim 1 in which the annealing in step (b) is performed for a length of time of at least 2 hours.

5. The method for the preparation of a composite membrane for X-ray lithography as claimed in claim 1 in which the composite film deposited on the substrate surface after annealing in step (b) has a tensile internal stress in the range from $0.1 \times 10^9$ to $8.0 \times 10^9$ dynes/cm$^2$.

6. The method for the preparation of a composite membrane for X-ray lithography as claimed in claim 1 in which the substrate is a wafer of silicon.

* * * * *